(12) United States Patent
Stark et al.

(10) Patent No.: US 6,515,871 B1
(45) Date of Patent: *Feb. 4, 2003

(54) PROTECTION SHIELD FOR AN ELECTRONIC CARTRIDGE

(75) Inventors: Michael Stark, Tempe; Michael Rutigliano, Chandler, both of AZ (US); Bill Lieska, Shelton; Peter A. Davison, Sumner, both of WA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,498

(22) Filed: Feb. 17, 1998

(51) Int. Cl.[7] ............................. H05K 9/00; H05K 7/20
(52) U.S. Cl. ..................... 361/818; 361/704; 361/752; 361/800; 174/35 R
(58) Field of Search ................................. 361/752, 753, 361/797, 800, 801, 802, 816, 818, 825, 704, 720; 174/35 R, 35 GC

(56) References Cited

U.S. PATENT DOCUMENTS

| | | |
|---|---|---|
| 3,662,224 A | 5/1972 | Rauch |
| 3,801,874 A | 4/1974 | Stefani |
| 3,895,267 A | 7/1975 | Gordon et al. |
| 4,110,552 A | 8/1978 | Lombardi |
| 4,266,267 A | 5/1981 | Ruegg |
| 4,521,827 A | 6/1985 | Jordan et al. |
| 4,602,315 A | 7/1986 | Breese |
| 4,652,971 A | 3/1987 | Peterson et al. |
| 4,717,989 A | 1/1988 | De Barros et al. |
| 4,899,256 A | 2/1990 | Sway-Tin |
| 4,910,434 A | 3/1990 | Doumani et al. |
| 4,917,618 A | 4/1990 | Behrens et al. |
| 5,006,667 A | 4/1991 | Lonka |
| 5,014,160 A | 5/1991 | McCoy Jr. |
| 5,020,866 A | 6/1991 | McIlwraith |
| 5,043,534 A | 8/1991 | Mahulikar et al. |
| 5,055,971 A | * 10/1991 | Fudala et al. ........... 361/816 X |
| 5,241,453 A | * 8/1993 | Bright et al. ........... 361/816 X |
| RE34,393 E | 9/1993 | McIlwraith |
| 5,250,752 A | 10/1993 | Cutright |
| 5,278,351 A | 1/1994 | Herrick |
| 5,289,347 A | 2/1994 | McCarthy et al. |
| 5,294,994 A | 3/1994 | Robinson et al. |
| 5,303,113 A | 4/1994 | Goleman et al. |
| 5,309,315 A | 5/1994 | Naedel et al. |
| 5,323,299 A | 6/1994 | Weber |
| 5,333,100 A | 7/1994 | Anhalt et al. |
| 5,353,201 A | * 10/1994 | Maeda ....................... 361/816 |
| 5,354,951 A | 10/1994 | Lang Sr. et al. |
| 5,398,822 A | 3/1995 | McCarthy et al. |
| 5,422,433 A | 6/1995 | Rivera et al. |

(List continued on next page.)

FOREIGN PATENT DOCUMENTS

| | | | |
|---|---|---|---|
| JP | 407245492 A | * | 8/1995 |
| JP | 410084193 A | * | 3/1998 |

*Primary Examiner*—Jayprakash N. Gandhi
(74) *Attorney, Agent, or Firm*—Blakely, Sokoloff, Taylor & Zafman LLP

(57) ABSTRACT

A shield for an electronic cartridge which has a pin that attaches a thermal element to a substrate. One edge of the substrate may have a plurality of conductive pads. The shield may have a base located adjacent to the conductive pads. The shield may include an arm which extends from the base and a finger which extends from the arm. The shield can be installed by sliding the arm toward the thermal element so that the pin engages and deflects the finger. The shield is moved toward the thermal element until the pin snaps into a notch located at the end of the finger. The finger may exert a spring force which pushes the base into the thermal element and secures the shield to the cartridge.

15 Claims, 2 Drawing Sheets

U.S. PATENT DOCUMENTS

| | | |
|---|---|---|
| 5,430,607 A | 7/1995 | Smith |
| 5,473,111 A | 12/1995 | Smith |
| 5,477,421 A | 12/1995 | Bethurum |
| 5,483,423 A | 1/1996 | Lewis et al. |
| 5,526,229 A | 6/1996 | Wakabayashi et al. |
| 5,545,843 A * | 8/1996 | Arvidsson et al. ..... 174/35 GC |
| 5,550,713 A | 8/1996 | Pressler et al. |
| 5,650,917 A | 7/1997 | Hsu |
| 5,659,459 A | 8/1997 | Wakabayashi et al. |
| 5,822,197 A | 10/1998 | Thuault |
| 5,829,601 A | 11/1998 | Yurchenco et al. |
| 5,838,542 A | 11/1998 | Nelson et al. |
| 5,856,910 A * | 1/1999 | Yurchenco et al. ......... 361/704 |
| 5,883,782 A | 3/1999 | Thurston et al. |
| 5,883,783 A | 3/1999 | Turturro |
| 5,889,656 A | 3/1999 | Yin |

* cited by examiner

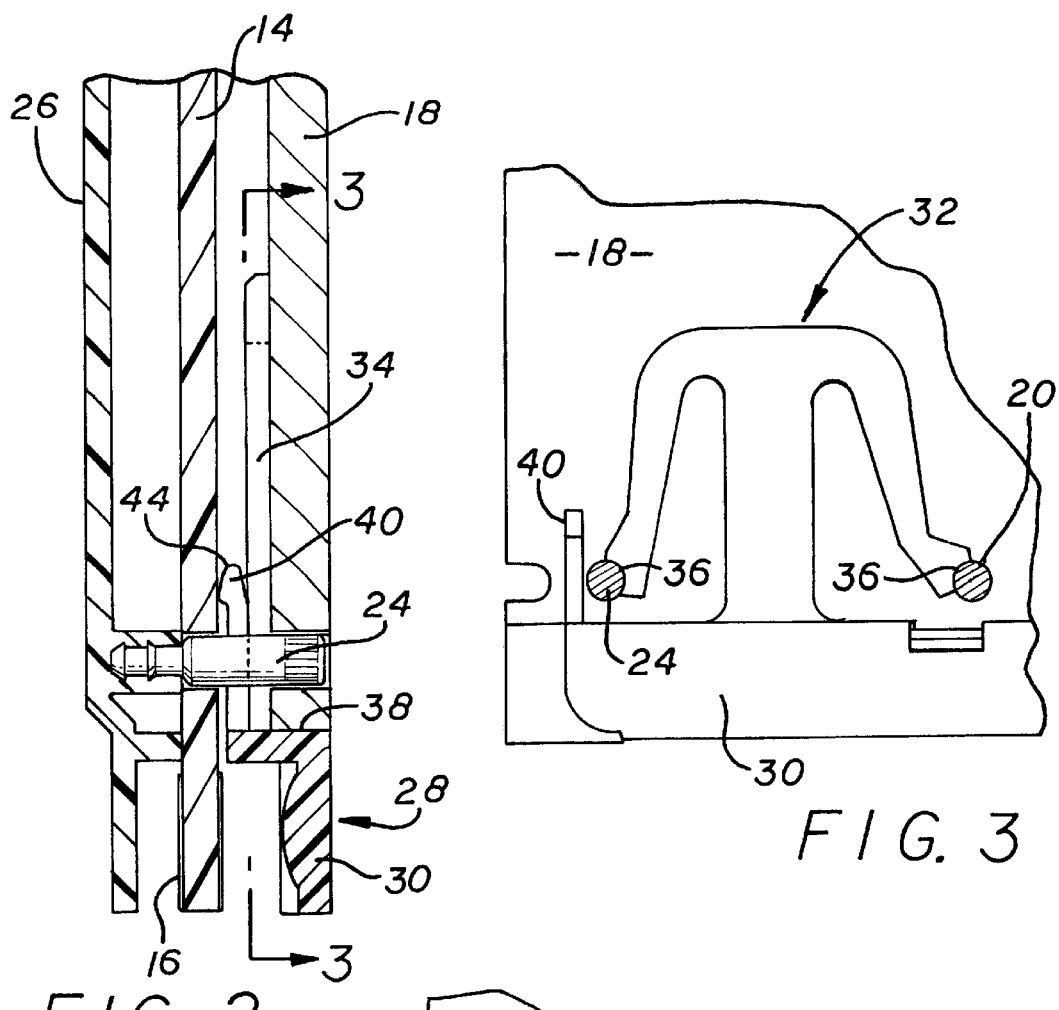
FIG. 2
FIG. 3
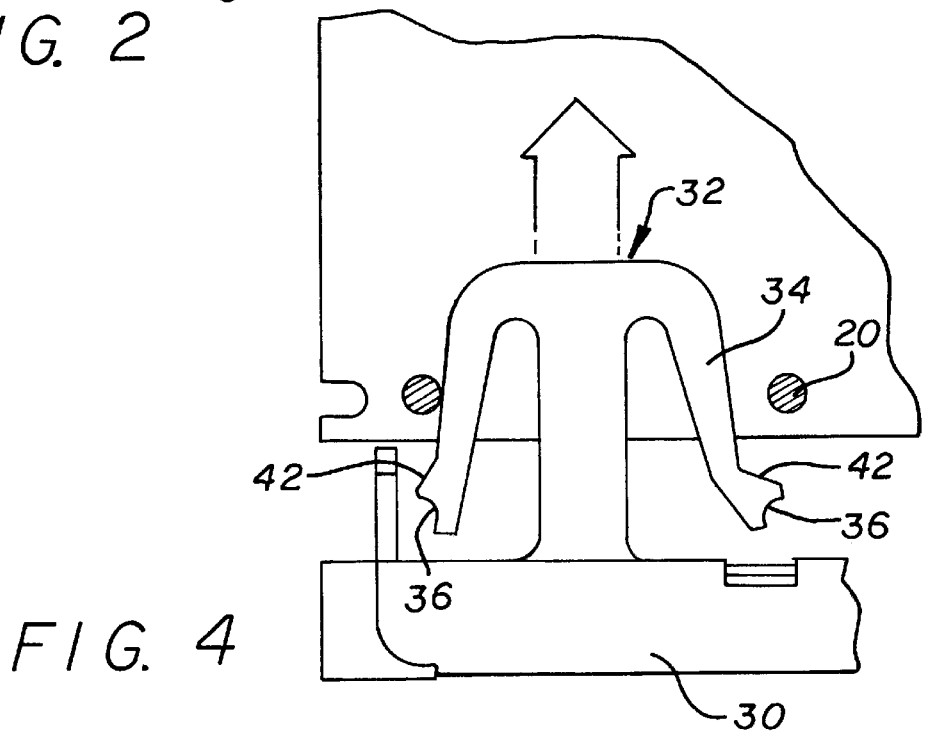
FIG. 4

PROTECTION SHIELD FOR AN ELECTRONIC CARTRIDGE

BACKGROUND OF THE INVENTION

1. Field of the Invention

The present invention relates to a protective shield for an electronic cartridge.

2. Background Information

Integrated circuits are typically assembled into packages that are soldered to a printed circuit board. One edge of the printed circuit board may contain a plurality of conductive pads that can be inserted into an electrical connector. The electrical connector can be mounted to a motherboard of a computer system. For example, memory devices are typically packaged onto a printed circuit board that is plugged into a card edge electrical connector. The conductive pads are exposed until the circuit board is plugged into the connector.

The circuit board assembly may be plugged into the connector by an operator at a manufacturing facility or by a consumer. The operator or consumer may come into contact with the exposed conductive pads and create an electrostatic discharge that damages the integrated circuits on the circuit board. It would be desirable to provide a shield for the conductive pads of the printed circuit board. It would also be desirable to assemble such a shield without any tools to reduce the complexity and cost of producing an electronic cartridge.

SUMMARY OF THE INVENTION

One embodiment of the present invention is a shield for an electronic cartridge which has a pin that extends from a substrate. The shield may include an arm which extends from a base. The arm may have a finger that engages the pin.

BRIEF DESCRIPTION OF THE DRAWINGS

FIG. 2 is a side cross-sectional view showing a shield attached to the assembly;

FIG. 3 is a top sectional view showing the shield attached to the assembly;

FIG. 4 is a top sectional view showing the shield being assembled to the cartridge.

DETAILED DESCRIPTION OF THE INVENTION

Figure 1:
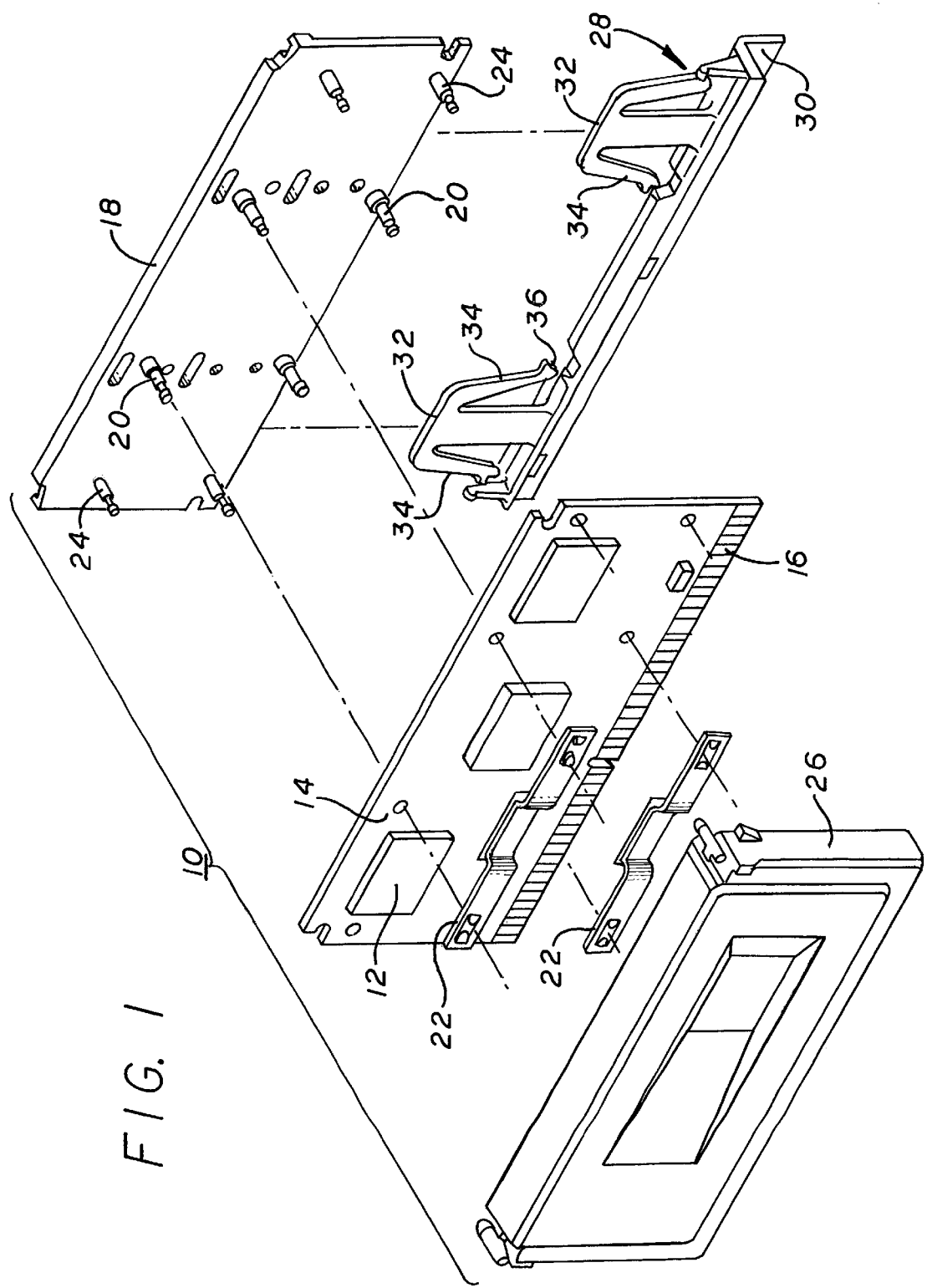
FIG. 1 is an exploded view of an embodiment of an electronic cartridge of the present invention.

One embodiment of the present invention is a shield for an electronic cartridge which has a pin that attaches a thermal element to a substrate. One edge of the substrate may have a plurality of conductive pads. The shield may have a base located adjacent to the conductive pads. The shield may include an arm which extends from the base and a finger which extends from the arm. The shield can be installed by sliding the arm toward the thermal element so that the pin engages and deflects the finger. The shield is moved toward the thermal element until the pin snaps into a notch located at the end of the finger. The finger may exert a spring force which pushes the base into the thermal element and secures the shield to the cartridge.

Referring to the drawings more particularly by reference numbers, FIG. 1 shows an embodiment of an electronic cartridge 10. The cartridge 10 may include one or more integrated circuit packages 12 that are mounted to a substrate 14. Each package 12 may contain one or more integrated circuits (not shown). The substrate 14 may be a printed circuit board which has surface pads, routing traces, power/ground planes, vias, etc. as is known in the art. One edge of the substrate 14 may have a plurality of conductive pads 16. The conductive pads 16 can be inserted into a card edge electrical connector (not shown) that is mounted to a motherboard (not shown).

The cartridge 10 may include a thermal element 18 that is attached to the substrate 14 and thermally coupled to the integrated circuit package(s) 12. The thermal element 18 may be constructed from a thermally conductive material such as aluminum or copper. The thermal element 18 facilitates the removal of heat generated by the integrated circuits within the packages 12. A heat sink (not shown) may be attached to the thermal element 18.

The cartridge 10 may have a plurality of first pins 20 that extend from the thermal element 18 and through the substrate 14. The pins 20 may be attached to a pair of spring clips 22. The spring clips 22 and first pins 20 attach the thermal element 18 to the substrate 14. The cartridge 10 may also have a plurality of second pins 24 that extend from the thermal element 18 and through the substrate 14. The second pins 24 may be attached to a cover 26.

To minimize the weight of the cartridge 10 the width of the thermal element 18 may be limited to the area of the substrate 12 which contains the integrated circuit packages 12. The width limitation of the element 18 may expose the conductive pads 16 on one side of the substrate 14. The cartridge 10 may include a shield 28 that is attached to the thermal element 18 and located adjacent to the pads 16.

As shown in FIGS. 2 and 3, the shield 28 may include a base 30 that covers the conductive pads 16. Extending from the base 30 are a pair of arms 32. Each arm 32 may have a pair of fingers 34 that extend back toward the base 30. Each finger 34 may have a notch 36 that receives one of the pins 20 or 24. When assembled the fingers 34 may be slightly deflected to create a spring force which pushes a lip 38 of the base 30 into the thermal element 18 and secures the shield 28 in a plane parallel with the substrate 14.

The shield 28 may also have a pair of spring arms 40 that engage the substrate 14. The spring arms 40 exert a spring force that pushes the arms 32 into the thermal element 18 and secure the shield 28 in a direction perpendicular to the substrate 14.

The shield 28 can be assembled by sliding the arms 32 along the underside of the thermal element 18. As shown in FIG. 4, each shield finger 34 has a tapered cam surface 42 which engages a pin 20 or 24 and causes an inward deflection of the finger 34. As shown in FIG. 2, the spring arms 40 may also have tapered tips 44 which allow the arms 40 to slide along the substrate 14. Referring to FIG. 4, the shield 28 is inserted until the pins 20 and 24 snap into the notches 36 of the fingers 34. Assembly of the shield 28 does not require any tools and can be performed with a simple snap in process.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:

a thermal element;

a substrate;

a first pin that extends from the thermal element through the substrate;

a spring clip that is attached to the first pin extending through the substrate; and a shield that is located adjacent to the thermal element, the shield including a base that covers a portion of the substrate, and an arm having a notch to snap into the first pin as the pin is extending through from the thermal element to the substrate and a first side surface that is in physical contact with the thermal element.

2. The electronic cartridge as recited in claim 1 wherein the finger is deflected and exerts a force on the first pin to push said base into said thermal element.

3. The electronic cartridge as recited in claim 1, wherein the shield further including a one spring arm that extends from the base and applied a force against the substrate to push the arm into the thermal element so that the side surface of the arm is substantially flush against the thermal element.

4. The electronic cartridge as recited in claim 3, wherein the spring arm engages the substrate.

5. The electronic cartridge as recited in claim 1, wherein said finger has a tapered cam surface.

6. The electronic cartridge as recited in claim 1, wherein the base covers a plurality of conductive pads located along an edge of the substrate.

7. The electronic cartridge as recited in claim 1, wherein the substrate includes at least one integrated circuit package.

8. The electronic cartridge as recited in claim 7, wherein the thermal element is thermally coupled to the at least one integrated circuit package.

9. The electronic cartridge as recited in claim 1, wherein the substrate further includes a plurality of conductive pads along an edge of the substrate.

10. The electronic cartridge of claim 1 further comprising a cover.

11. The electronic cartridge of claim 10 further comprising a second pin that extends from said thermal element through said substrate and is attached to said cover.

12. The electronic cartridge of claim 1, wherein one side of the substrate includes a plurality of conductive pads located adjacent to said base of said shield.

13. An electronic cartridge, comprising:

a thermal element;

a substrate;

a plurality of pins including a first pin and a second pin that extend from the thermal element to the substrate;

a spring clip that is extended to the substrate by the first pin; and a shield that is located adjacent to the thermal element, the shield including (i) a base that covers a portion of the substrate and is adjacent to a plurality of conductive pads, (ii) an arm that extends from the base and includes a finger for engagement with the second pin, the finger including a notch to snap into the first pin; and (iii) a spring arm that extends at least one from the base and applied a force against the substrate to push the spring arm into the thermal element so that a back surface of the arm is substantially flush against the thermal element.

14. The electronic cartridge of claim 13 further comprising a cover.

15. The electronic cartridge of claim 14, wherein the second pin attaches to the cover.

* * * * *